United States Patent
Ebata et al.

(10) Patent No.: US 9,850,355 B2
(45) Date of Patent: *Dec. 26, 2017

(54) LAMINATE FILM

(71) Applicant: TOYOBO CO., LTD., Osaka-shi, Osaka (JP)

(72) Inventors: Takashi Ebata, Otsu (JP); Kiyoshi Iseki, Otsu (JP)

(73) Assignee: Toyobo Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/765,488

(22) PCT Filed: Jan. 31, 2014

(86) PCT No.: PCT/JP2014/052249
§ 371 (c)(1),
(2) Date: Aug. 3, 2015

(87) PCT Pub. No.: WO2014/123068
PCT Pub. Date: Aug. 14, 2014

(65) Prior Publication Data
US 2015/0376357 A1    Dec. 31, 2015

(30) Foreign Application Priority Data

Feb. 6, 2013   (JP) ................................ 2013-021810
Jul. 4, 2013   (JP) ................................ 2013-140767
Sep. 6, 2013   (JP) ................................ 2013-185332

(51) Int. Cl.
*B32B 27/06*       (2006.01)
*C08J 7/04*        (2006.01)
(Continued)

(52) U.S. Cl.
CPC ................. *C08J 5/18* (2013.01); *C08J 7/042* (2013.01); *C08J 7/045* (2013.01); *C09D 7/001* (2013.01);
(Continued)

(58) Field of Classification Search
CPC .................................................... C07D 251/38
See application file for complete search history.

(56) References Cited

U.S. PATENT DOCUMENTS 5,089,851 A  *  2/1992  Tanaka .............. G03G 15/0233
                                                       361/225
2007/0184187 A1   8/2007  Jahromi
(Continued)

FOREIGN PATENT DOCUMENTS

CN    102015289 A    4/2011
JP    H02-233666 A   9/1990
(Continued)

OTHER PUBLICATIONS

Japanese Patent Office, International Search Report in International Patent Application No. PCT/JP2014/052249 (dated May 13, 2014) English translation.
(Continued)

*Primary Examiner* — Ramsey Zacharia
(74) *Attorney, Agent, or Firm* — Leydig, Voit & Mayer, Ltd.

(57) ABSTRACT

The present invention is a laminate film comprising a plastic film, and an inorganic layer and an organic layer containing a 1,3,5-triazine derivative laid on at least one surface of the plastic film, wherein the 1,3,5-triazine derivative has a sulfur-containing group as a substituent on at least one of 2, 4 and 6 positions.

8 Claims, 1 Drawing Sheet

(51) Int. Cl.
- *C08J 7/06* (2006.01)
- *C08J 5/18* (2006.01)
- *C09D 7/00* (2006.01)
- *C23C 14/08* (2006.01)
- *C23C 14/10* (2006.01)
- *C23C 14/12* (2006.01)
- *C23C 14/24* (2006.01)

(52) U.S. Cl.
CPC ............ *C23C 14/08* (2013.01); *C23C 14/081* (2013.01); *C23C 14/10* (2013.01); *C23C 14/12* (2013.01); *C23C 14/243* (2013.01); *B32B 27/06* (2013.01); *C08J 7/065* (2013.01); *C08J 2367/02* (2013.01)

(56) References Cited

U.S. PATENT DOCUMENTS

| | | | |
|---|---|---|---|
| 2007/0207319 A1 | 9/2007 | Jahromi | |
| 2007/0269665 A1 | 11/2007 | Shimoohsako et al. | |
| 2010/0119852 A1* | 5/2010 | Tsuchida | C08G 77/20 428/447 |
| 2010/0310884 A1 | 12/2010 | Jahromi | |
| 2011/0045258 A1 | 2/2011 | Jahromi et al. | |
| 2013/0260144 A1 | 10/2013 | Yamazaki et al. | |

FOREIGN PATENT DOCUMENTS

| | | | |
|---|---|---|---|
| JP | EP 1152070 A1 * | 11/2001 | ............ C25D 1/04 |
| JP | 2002-019010 A | 1/2002 | |
| JP | 2005-002334 A | 1/2005 | |
| JP | 2005-288856 A | 10/2005 | |
| JP | 2006-116708 A | 5/2006 | |
| JP | 2007-503529 A | 2/2007 | |
| JP | 2007-508161 A | 4/2007 | |
| JP | 2005-059537 A | 3/2010 | |
| JP | 2010-090186 A | 4/2010 | |
| JP | 2010-111819 A | 5/2010 | |
| JP | 2010-533608 A | 10/2010 | |
| JP | 4863024 B2 | 1/2012 | |
| JP | 2013-014126 A | 1/2013 | |

OTHER PUBLICATIONS

Chinese Patent Office, Notification of First Office Action in Chinese Patent Application No. 201480007809.5 (dated Apr. 25, 2016).
Japanese Patent Office, International Search Report in International Patent Application No. PCT/JP2014/052669 (dated Apr. 22, 2014).
Japanese Patent Office, Notification of Office Action in Japanese Patent Application No. 2013-021809 (dated May 31, 2016).
Chinese Patent Office, Notification of the Second Office Action in Chinese Patent Application No. 201480007809.5 (dated Nov. 28, 2016).
Chinese Patent Office, Notification of the Third Office Action in Chinese Patent Application No. 201480007809.5 (dated Mar. 7, 2017).
European Patent Office, Extended European Search Report in European Patent Application No. 14749484.3 (dated Oct. 11, 2016).
Chinese Patent Office, Notification of First Office Action in Chinese Patent Application No. 201480007801.9 (dated Aug. 29, 2016).
European Patent Office, Extended European Search Report in European Patent Application No. 14749514.7 (dated Aug. 8, 2016).
Japanese Patent Office, Notification of Reasons for Rejection in Japanese Patent Application No. 2013-185332 (dated Apr. 4, 2017).
Chinese Patent Office, Notification of the Second Office Action in Chinese Patent Application No. 201480007801.9 (dated Apr. 19, 2017).
Chinese Patent Office, The Fourth Office Action in Chinese Patent Application 201480007809.5 (Sep. 14, 2017).

* cited by examiner

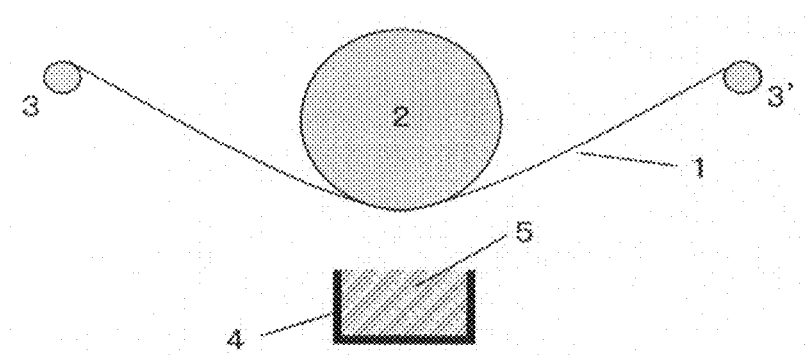

LAMINATE FILM

CROSS-REFERENCE TO RELATED APPLICATIONS

This patent application is the U.S. national phase of International Patent Application No. PCT/JP2014/052249, filed Jan. 31, 2014, which claims the benefit of Japanese Patent Application No. 2013-021810, filed on Feb. 6, 2013, Japanese Patent Application No. 2013-140767, filed on Jul. 4, 2013, and Japanese Patent Application No. 2013-185332, filed on Sep. 6, 2013, which are incorporated by reference in their entireties herein.

TECHNICAL FIELD

The present invention relates to a laminate film including an inorganic layer and an organic layer and excellent in adhesion properties and gas barrier properties, in which the laminate film is widely applicable to not only uses for packaging of foods, pharmaceutical products, industrial products, etc. but also to industrial uses for solar cells, electronic paper, organic EL elements, semiconductor elements, etc.

BACKGROUND ART

Conventionally, as a laminate film to be used for food packaging applications and having gas barrier properties, there are known films formed by laminating a thin film of metal such as aluminum on a thin film of inorganic oxide such as silicon oxide or aluminum oxide (hereinafter, referred to as inorganic layer) or on a surface of a plastic film. However, in industrial uses for solar cells, electronic paper, organic EL elements, semiconductor elements, etc., the above laminate films are insufficient in gas barrier properties, and it is required to further improve the gas barrier properties.

A method for laminating an inorganic layer and a thin film containing an organic material (hereinafter, referred to as organic layer) on a plastic film is supposed to be one of means for improving the gas barrier properties.

The organic layer is formed by a common coating method, but it is also possible to be formed by employing a vapor deposition method. Vapor deposition methods can be broadly divided into physical vapor deposition methods such as a vacuum vapor deposition method, a sputtering method and an ion plating method, and chemical vapor deposition methods such as PECVD (plasma enhanced CVD), and usually, a physical vapor deposition is employed.

When a physical vapor deposition method is employed, gas barrier properties can be obtained to a certain extent, and even when a substance is vapor-deposited on a further wide area, the film thickness can be made even. In addition, when a physical vapor deposition method is employed, vacuum film formation of organic substance and inorganic substance is continuously carried out so that the formation efficiency such as cost reduction and shortening of film formation time can be improved.

As a laminate film including an inorganic layer and an organic layer, there are known laminate films formed by laminating an inorganic layer and an organic layer containing melamine (e.g., reference to Patent Documents 1 and 2). In the patent documents above, methods are proposed for laminating an inorganic layer on a plastic film and vapor-depositing an organic layer on the inorganic layer by vacuum vapor deposition method. The organic layer contains triazine compounds (e.g., melamine salts such as melamine, melem, melam, ammeline, ammelide, cyanuric acid, 2-ureidomelamine and melamine cyanurate, and melamines functionalized by polymerizable group such as acrylate, epoxy, or vinyl ether) or a mixture of the above triazine compounds.

Incidentally, in the case of using the laminate film for packaging uses, it is required not only to be excellent in gas barrier properties but also to be excellent in adhesive force between the organic layer and the inorganic layer (hereinafter, referred to as adhesive force). However, although having gas barrier properties, the laminate films produced by the methods described in Patent Documents 1 and 2 have a problem that the adhesive force is weak.

PRIOR ART DOCUMENTS

Patent Documents

Patent Document 1 JP-A-2007-503529
Patent Document 2: JP-A-2007-508161

SUMMARY OF THE INVENTION

Problems to be Solved by the Invention

An object of the present invention is to provide a laminate film including an inorganic layer and an organic layer and excellent in adhesion properties and gas barrier properties.

Solutions to the Problems

The present inventors have incorporated to an organic layer a 1,3,5-triazine derivative having a sulfur-containing group as a substituent on at least one of 2, 4, and 6 positions. As a result, both of adhesion properties and gas barrier properties can be obtained, and accordingly the present invention has been completed.

The laminate film according to the present invention is comprising a plastic film, and an inorganic layer and an organic layer containing a 1,3,5-triazine derivative laid on at least one surface of the plastic film. The 1,3,5-triazine derivative has a sulfur-containing group as a substituent on at least one of 2, 4 and 6 positions.

It is preferable that the inorganic layer is laid on at least one surface of the plastic film, and the organic layer is laid on a surface of the inorganic layer.

It is preferable that the 1,3,5-triazine derivative is triazine trithiol or triazine dithiol, and it is more preferable that the 1,3,5-triazine derivative is triazine trithiol.

It is preferable that the inorganic layer and the organic layer are vapor-deposited by vacuum vapor deposition method.

Effects of the Invention

The laminate film of the present invention obtains both of adhesion properties and gas barrier properties even when an inorganic layer and an organic layer are formed on a surface of a plastic film. The laminate film of the present invention is widely applicable to not only uses for packaging of foods, pharmaceutical products, industrial products, etc. but also to industrial uses for solar cells, electronic paper, organic EL elements, semiconductor elements, etc.

BRIEF DESCRIPTION OF THE DRAWING

FIG. 1 is a schematic diagram of a vapor deposition apparatus for producing the laminate film of the present invention.

MODE FOR CARRYING OUT THE INVENTION

The laminate film of the present invention includes a plastic film and an inorganic layer and an organic layer containing a 1,3,5-triazine derivative laid on at least one surface of the plastic film. Hereinafter, the physical properties and method for producing the laminate film of the present invention will be described.

[Plastic Film]

A plastic film in the present invention is made of an organic polymer resin and is obtained by stretching in the longitudinal direction and/or width direction after melt extrusion, and then further being subjected to thermal fixation and cooling. Examples of the organic polymer resin include polyolefins such as polyethylene and polypropylene; polyesters such as polyethylene terephthalate, polybutylene terephthalate and polyethylene 2,6-naphthalate; polyamides such as nylon 6, nylon 4, nylon 66, nylon 12 and wholly aromatic polyamides; polyvinyl chloride; polyvinylidene chloride; polyvinyl alcohol; polyamide imide; polyimide; polyether imide; polysulfone; polyphenylene sulfide; polyphenylene oxide; etc. These organic polymer resins may be copolymerized with a small amount of other organic monomers or may be blended with other organic polymers.

Examples of the preferable polyesters include polyethylene terephthalate, polybutylene terephthalate, polyethylene-2,6-naphthalate, etc., and copolymers containing these polyesters as a main component may be used.

When a polyester copolymer is used, a main component as the dicarboxylic acid component of the polyester copolymer is preferably an aromatic dicarboxylic acid such as terephthalic acid, isophthalic acid, phthalic acid, or 2,6-naphthalenedicarboxylic acid. Polyfunctional carboxylic acids such as trimellitic acid and pyromellitic acid; aliphatic dicarboxylic acids such as adipic acid and sebacic acid; etc., are used as other carboxylic acid components. A main component as the glycol component of the polyester copolymer is preferably ethylene glycol or 1,4-butanediol, and aliphatic glycols such as diethylene glycol, propylene glycol and neopentyl glycol; aromatic glycols such as p-xylylene glycol; alicyclic glycols such as 1,4-cyclohexane dimethanol; polyethylene glycols having a weight average molecular weight of 150 to 20000; etc., are used as other glycol components.

The proportion of the copolymerization component in the polyester copolymer is 20% by mass or less. If the proportion of the copolymerization component exceeds 20% by mass, film strength, transparency, heat resistance, etc. may be inferior. These polyester copolymers may be copolymerized with a small amount of other organic monomers or may be blended with other organic polymers.

Examples of the preferable polyamides include polycaproamide (nylon 6), poly-ε-aminoheptanoic acid (nylon 7), poly-ε-aminononanoic acid (nylon 9), polyundecaneamide (nylon 11), polylaurinlactam (nylon 12), polyethylenediamine adipamide (nylon 2,6), polytetramethylene adipamide (nylon 4,6), polyhexamethylene adipamide (nylon 6,6), polyhexamethylene sebacamide (nylon 6,10), polyhexamethylene dodecamide (nylon 6,12), polyoctamethylene dodecamide (nylon 8,12), polyoctamethylene adipamide (nylon 8,6), polydecamethylene adipamide (nylon 10,6), polydecamethylene sebacamide (nylon 10,10), polydodecamethylene dodecamide (nylon 12,12) and metaxylylene diamine-6nylon (MXD 6). Copolymers containing these polyamides as a main component may be used.

Examples of the polyamide copolymers include a caprolactam/laurinlactam copolymer, a caprolactam/hexamethylenediammonium adipate copolymer, a laurinlactam/hexamethylenediammonium adipate copolymer, a hexamethylenediammonium adipate/hexamethylenediammonium sebacate copolymer, an ethylenediammonium adipate/hexamethylenediammonium adipate copolymer, a caprolactam/hexamethylenediammonium adipate/hexamethylenediammonium sebacate copolymer, etc.

It is also effective to add to these polyamides plasticizers such as aromatic sulfoneamides, p-hydroxybenzoic acid and esters; elastomer components with low elastic modulus; and lactams, as a flexibility improvement component of the film.

Furthermore, known additives, for example, a ultraviolet absorbing agent, an antistatic agent, a plasticizer, a lubricant, a coloring agent, etc. may be added to the above organic polymer resins. The transparency of the film is not particularly limited, but when the transparency is required, films having a light transmittance of 50% or higher are preferable.

Unless an object of the present invention is not deteriorated, the plastic film in the present invention may be subjected to a surface treatment such as a corona discharge treatment, a plasma discharge treatment, a flame treatment, or a surface-roughening treatment; a known anchor coating treatment; printing; decoration; etc. before an organic layer and an inorganic layer are formed thereon.

The thickness of the plastic film in the present invention is preferably in a range of 3 to 500 μm and more preferably in a range of 6 to 300 μm.

[Inorganic Layer]

An inorganic layer in the present invention is not particularly limited, and examples of the substance for the inorganic layer include metals such as Al, Si, Ti, Zn, Zr, Mg, Sn, Cu and Fe; oxides, nitrides, fluorides and sulfides of these metals; etc., and specifically include $SiO_x$ (x=1.0 to 2.0), alumina, magnesia, zinc sulfide, titania, zirconia, cerium oxide and their mixtures. The inorganic layer may be a single layer or a layered body of two or more layers. The inorganic layer and the organic layer described in detail below may be layered on only one surface or on both surfaces of the plastic film. A commercially available vapor deposition polyester film such as "ECOSYAR (registered trademark) VE 100" manufactured by TOYOBO Co., Ltd., which is obtained by vapor-depositing an inorganic layer on a plastic film, may be used. A vapor-deposited nylon film is also usable.

The inorganic layer in the present invention is preferably a multicomponent-system inorganic layer containing at least silicon oxide and aluminum oxide and more preferably a binary inorganic layer composed of silicon oxide and aluminum oxide, in terms of excellent gas barrier properties.

The above silicon oxide is composed of a mixture of Si and various kinds of silicon oxides such as SiO and $SiO_2$, and the above aluminum oxide is composed of a mixture of Al and various kinds of aluminum oxides such as AlO and $Al_2O_3$. The bonding amount of oxygen in the respective oxides differs depending on the respective production conditions.

When silicon oxide and aluminum oxide are used in combination, the content of aluminum oxide in the inorganic layer is preferably 20 to 99% by mass and more preferably 20 to 75% by mass.

If the content of aluminum oxide is lower than 20% by mass, the gas barrier properties may not be necessarily sufficient. On the other hand, if the content of aluminum oxide exceeds 99% by mass, the flexibility of the vapor deposition film is lowered and the laminate film becomes relatively weak in bending and dimensional change, so that the effect of the combination use of both may be lowered.

The thickness of the inorganic layer is usually preferably 1 to 800 nm and more preferably 5 to 500 nm. If the thickness is thinner than 1 nm, it may become difficult to obtain satisfactory gas barrier properties. On the other hand, if the thickness is made too thick exceeding 800 nm, no effect to improve gas barrier properties corresponding to the thickness increase can be caused and rather it is disadvantageous in terms of bending resistance and production cost.

Examples of the typical method to be employed for forming the inorganic layer include known methods of physical vapor deposition methods such as a vacuum vapor deposition method, a sputtering method and an ion plating method; and chemical vapor deposition methods such as PECVD (plasma enhanced CVD); etc. The inorganic layer is preferably formed by vacuum vapor deposition method.

When a vacuum vapor deposition method is employed, examples of a vapor deposition raw material to be used include metals such as aluminum, silicon, titanium, magnesium, zirconium, cerium and zinc, as well as compounds such as $SiO_x$ (x=1.0 to 2.0), alumina, magnesia, zinc sulfide, titania and zirconia, and their mixtures. The vacuum vapor deposition method is a method for heating an inorganic material in vacuum, heating and evaporating a material in a crucible, and then depositing the material on the plastic film or the organic layer. In order to make vacuum, the inside of a vapor deposition apparatus is vacuum-evacuated to lower the pressure preferably to $3.0 \times 10^{-2}$ Pa and more preferably to $1.0 \times 10^{-2}$ Pa.

Resistance heating, high frequency induction heating, electron beam heating, etc., may be employed for heating the inorganic material. It is also possible to introduce oxygen, nitrogen, hydrogen, argon, carbonic acid gas, water vapor, etc. as a reaction gas or to employ ozone-added or ion-assisted reactive vapor deposition.

Further, the vacuum vapor deposition method may be altered by applying bias to the plastic film, or heating or cooling the plastic film by a roll. The roll temperature is preferably −20 to 40° C.

When the inorganic layer of the present invention is a multicomponent-system inorganic layer containing at least silicon oxide and aluminum oxide, the multicomponent inorganic layer is preferably treated in water vapor gas at a temperature of 40 to 60° C. and 1 to 3 kPa for 50 hours or more.

The thin film formation conditions such as vapor deposition material, reaction gas, bias applied to substrate, and heating/cooling may be similarly altered also when a sputtering method, an ion plating method, or a CVD method is employed.

[Organic Layer]

An organic layer is laid on the plastic film or the inorganic layer. An organic layer is preferably laid on a surface of the inorganic layer.

The organic layer contains a 1,3,5-triazine derivative. The 1,3,5-triazine derivative has a sulfur-containing group as a substituent on at least one of 2, 4 and 6 positions. When such an organic layer is used, gas barrier properties are improved upon combination with the inorganic layer. The organic layer itself may not have gas barrier properties, but preferably has gas barrier properties.

Examples of the 1,3,5-triazine derivative include 1,3,5-triazine derivatives represented by the following chemical formula, and the 1,3,5-triazine derivatives may be used alone or in combination. Incorporation of the 1,3,5-triazine derivative to the organic layer can cause gas barrier properties.

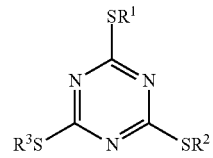

The 1,3,5-triazine derivative represented by the above formula has sulfur-containing groups as a substituent on 2, 4 and 6 positions, and the sulfur atom in the substituent is directly bonded to a carbon atom of 2, 4 and 6 positions. $R^1$, $R^2$ and $R^3$ in the above formula may be, for example, H, $CH_3$, $C_2H_5$, $C_4H_9$, $C_6H_{13}$, $C_8H_{17}$, $C_{10}H_{21}$, $C_{12}H_{25}$, $C_{18}H_{37}$, $C_{20}H_{41}$, $C_{22}H_{45}$, $C_{24}H_{49}$, $CF_3C_6H_4$, $C_4F_9C_5H_4$, $C_6F_{13}C_5H_4$, $C_8F_{17}C_6H_4$, $C_{10}F_{21}C_6H_4$, $C_6F_{11}C_6H_4$, $C_9F_{17}CH_9$, $C_{10}F_{21}CH_2$, $C_4F_9CH_2$, $C_6F_{13}CH_2CH_2$, $C_8F_{17}CH_2CH_2$, $C_{10}F_{21}CH_2CH_2$, $CH_2=CHCH_2$, $CH_2=CH(CH_2)_8$, $CH_2=CH(CH_2)_9$, $C_8H_{17}CH=C_8H_{16}$, $C_6H_{11}$, $C_6H_5CH_2$, $C_6H_5CH_2CH_2$, $CH_2=CH(CH_2)_4COOCH_2CH_2$, $CH_2=CH(CH_2)_8COOCH_2CH_2$, $CH_2=CH(CH_2)_9COOCH_2CH_2$, $C_4F_9CH_2=CHCH_2$, $C_6F_{13}CH_2=CHCH_2$, $C_8F_{17}CH_2=CHCH_2$, $C_{10}F_{21}CH_2=CHCH_2$, $C_4F_9CH_2CH(OH)CH_2$, $C_6F_{13}CH_2CH(OH)CH_2$, $C_8F_{17}CH_2CH(OH)CH_2$, $C_{10}F_{21}CH_2CH(OH)CH_2$, $CH_2=CH(CH_2)_4COO(CH_2CH_2)_2$, $CH_2=CH(CH_2)_8COO(CH_2CH_2)_2$, $CH_2=CH(CH_2)_9COO(CH_2CH_2)_2$, $C_4F_9COOCH_2CH_2$, $C_6F_{13}COOCH_2CH_2$, $C_8F_{17}COOCH_2CH_2$, $C_{10}F_{21}COOCH_2CH_2$, and $R^1$, $R^2$ and $R^3$ may be the same or different from one another.

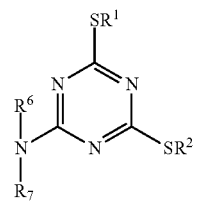

The 1,3,5-triazine derivative represented by the above formula has sulfur-containing groups as a substituent on any two of 2, 4 and 6 positions, and the sulfur atom in the substituent is directly bonded to a carbon atom of any one of 2, 4 and 6 positions. $R^1$, $R^2$, $R^6$ and $R^7$ in the above formula may be, for example, H, $CH_3$, $C_2H_5$, $C_4H_9$, $C_6H_{13}$, $C_8H_{17}$, $C_{10}H_{21}$, $C_{12}H_{25}$, $C_{18}H_{37}$, $C_{20}H_{41}$, $C_{22}H_{45}$, $C_{24}H_{49}$, $CF_3C_6H_4$, $C_4F_9C_5H_4$, $C_6F_{13}C_5H_4$, $C_8F_{17}C_6H_4$, $C_{10}F_{21}C_6H_4$, $C_6F_{11}C_6H_4$, $C_9F_{17}CH_2$, $C_{10}F_{21}CH_2$, $C_4F_9CH_2$, $C_6F_{13}CH_2CH_2$, $C_8F_{17}CH_2CH_2$, $C_{10}F_{21}CH_2CH_2$, $CH_2=CHCH_2$, $CH_2=CH(CH_2)_8$, $CH_2=CH(CH_2)_9$, $C_8H_{17}CH=C_8H_{16}$, $C_6H_{11}$, $C_6H_5CH_2$, $C_6H_5CH_2CH_2$, $CH_2=CH(CH_2)_4COOCH_2CH_2$, $CH_2=CH(CH_2)_8COOCH_2CH_2$, $CH_2=CH(CH_2)_9COOCH_2CH_2$, $C_4F_9CH_2=CHCH_2$, $C_6F_{13}CH_2=CHCH_2$, $C_8F_{17}CH_2$=CHCH$_2$, $C_{10}F_{21}CH_2$=CHCH$_2$, $C_4F_9CH_2CH$(OH)CH$_2$, $C_6F_{13}CH_2CH$(OH)CH$_2$, $C_8F_{17}CH_2CH$(OH)CH$_2$, $C_{10}F_{21}CH_2CH$(OH)CH$_2$, CH$_2$=CH(CH$_2$)$_4$COO(CH$_2$CH$_2$)$_2$, CH$_2$=CH(CH$_2$)$_8$COO(CH$_2$CH$_2$)$_2$, CH$_2$=CH(CH$_2$)$_9$COO(CH$_2$CH$_2$)$_2$, $C_4F_9$COOCH$_2$CH$_2$, $C_6F_{13}$COOCH$_2$CH$_2$, $C_8F_{17}$COOCH$_2$CH$_2$, or $C_{10}F_{21}$COOCH$_2$CH$_2$, and R$^1$, R$^2$, R$^6$, and R$^7$ may be the same or different from one another.

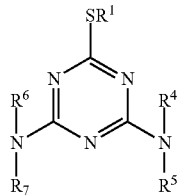

The 1,3,5-triazine derivative represented by the above formula has a sulfur-containing group as a substituent on any one of 2, 4 and 6 positions, and the sulfur atom in the substituent is directly bonded to a carbon atom of any one of 2, 4 and 6 positions. R$^1$ and R$^4$ to R$^7$ in the above formula may be, for example, H, CH$_3$, C$_2$H$_5$, C$_4$H$_9$, C$_6$H$_{13}$, C$_8$H$_{17}$, C$_{10}$H$_{21}$, C$_{12}$H$_{25}$, C$_{18}$H$_{27}$, C$_{20}$H$_{41}$, C$_{22}$H$_{45}$, C$_{24}$H$_{49}$, CF$_3$C$_6$H$_4$, C$_4$F$_9$C$_5$H$_4$, C$_6$F$_{13}$C$_5$H$_4$, C$_8$F$_{17}$C$_6$H$_4$, C$_{10}$F$_{21}$C$_6$H$_4$, C$_6$H$_{11}$C$_6$H$_4$, C$_9$F$_{17}$CH$_2$, C$_{10}$F$_{21}$CH$_2$, C$_4$F$_9$CH$_2$, C$_6$F$_{13}$CH$_2$CH$_2$, C$_8$F$_{17}$CH$_2$CH$_2$, C$_{10}$F$_{21}$CH$_2$CH$_2$, CH$_2$=CHCH$_2$, CH$_2$=CH(CH$_2$)$_8$, CH$_2$=CH(CH$_2$)$_9$, C$_8$H$_{17}$CH$_2$=C$_8$H$_{16}$, C$_6$H$_{11}$, C$_6$H$_5$CH$_2$, C$_6$H$_5$CH$_2$CH$_2$, CH$_2$=CH(CH$_2$)$_4$COOCH$_2$CH$_2$, CH$_2$=CH(CH$_2$)$_8$COOCH$_2$CH$_2$, CH$_2$=CH(CH$_2$)$_9$COOCH$_2$CH$_2$, C$_4$F$_9$CH$_2$=CHCH$_2$, C$_6$F$_{13}$CH$_2$=CHCH$_2$, C$_8$F$_{17}$CH$_2$=CHCH$_2$, C$_{10}$F$_{21}$CH$_2$=CHCH$_2$, C$_4$F$_9$CH$_2$CH(OH)CH$_2$, C$_6$F$_{13}$CH$_2$CH(OH)CH$_2$, C$_8$F$_{17}$CH$_2$CH(OH)CH$_2$, C$_{10}$F$_{21}$CH$_2$CH(OH)CH$_2$, CH$_2$=CH(CH$_2$)$_4$COO(CH$_2$CH$_2$)$_2$, CH$_2$=CH(CH$_2$)$_8$COO(CH$_2$CH$_2$)$_2$, CH$_2$=CH(CH$_2$)$_9$COO(CH$_2$CH$_2$)$_2$, C$_4$F$_9$COOCH$_2$CH$_2$, C$_6$F$_{13}$COOCH$_2$CH$_2$, C$_8$F$_{17}$COOCH$_2$CH$_2$, C$_{10}$F$_{21}$COOCH$_2$CH$_2$, and R$^1$ and R$^4$ to R$^7$ may be the same or different from one another.

The 1,3,5-triazine derivative has a sulfur-containing group as a substituent on at least one of 2, 4 and 6 positions, and the sulfur atom in the sulfur-containing group is directly bonded to a carbon atom of any one of 2, 4 and 6 positions.

The 1,3,5-triazine derivative is preferably triazine dithiol having sulfur-containing groups as a substituent group on any two of 2, 4 and 6 positions or triazine trithiol (thiocyanuric acid) in which R$^1$, R$^2$ and R$^3$ are all H. The 1,3,5-triazine derivative is more preferably triazine trithiol.

The organic layer is preferably mainly composed of the 1,3,5-triazine derivative, and specifically preferably contain 50% by mass or more of the 1,3,5-triazine derivative. The proportion of the 1,3,5-triazine derivative is more preferably 70% by mass or more and furthermore preferably 100% by mass; that is, the organic layer consists of the 1,3,5-triazine derivative. In the organic layer, the lower the content of an organic polymer compound having a structure far from a planar structure, the structure possibly hindering gas barrier properties, is made, the more the 1,3,5-triazine derivative having a structure close to a planar structure is contained. Accordingly, it is supposed that the ring part included in the organic polymer compound can be layered in more planar state on a surface of the organic thin film layer, and excellent gas barrier properties of the 1,3,5-triazine derivative can be obtained sufficiently.

The lower limit of the thickness of the organic layer is preferably 5 nm. The upper limit of the thickness of the organic layer is preferably 300 nm, more preferably 250 nm, further preferably 200 nm, furthermore preferably 150 nm, particularly preferably 100 nm, and most preferably 60 nm.

As a method for coating the organic layer on the plastic layer or the inorganic layer, it is preferable to employ a vapor deposition method but not a method in which an organic polymer resin is used as a binder resin. When a vapor deposition method is employed, an organic polymer compound which may possibly hinder gas barrier properties can be lowered in the organic layer, and accordingly excellent gas barrier properties of the 1,3,5-triazine derivative can be obtained sufficiently.

Examples of the vapor deposition method include known methods of physical vapor deposition methods such as a vacuum vapor deposition method, a sputtering method and an ion plating method; and chemical vapor deposition methods such as PECVD (plasma enhanced CVD); etc. The organic layer is preferably formed by vacuum vapor deposition method.

The vacuum vapor deposition method is a method for heating an organic material in vacuum, heating and evaporating a material in a crucible, and then depositing the material on the plastic film or the organic layer. During vacuum vapor deposition, the inside of a vapor deposition apparatus is vacuum-evacuated to lower the pressure preferably to $3.0 \times 10^{-2}$ Pa, more preferably to $1.0 \times 10^{-2}$ Pa, and most preferably to high vacuum of $1.0 \times 10^{-4}$ Pa or lower.

Resistance heating, high frequency induction heating, electron beam heating, etc., may be employed for heating the organic material. When the 1,3,5-triazine derivative is vapor-deposited on a surface of a polyethylene terephthalate film, the deposition is carried out preferably at 200 to 400° C. and more preferably at 250 to 350° C. It is also possible to introduce oxygen, nitrogen, hydrogen, argon, carbonic acid gas, water vapor, etc. as a reaction gas or to employ ozone-added or ion-assisted reactive vapor deposition. Further, the thin film formation conditions may be arbitrarily altered by applying bias to the plastic film, or heating or cooling the plastic film.

A chemical bond of metal-S or metal-O—S is formed between the inorganic layer and the organic layer by forming the organic layer containing the 1,3,5-triazine derivative having a sulfur-containing group as a substituent on at least one of 2, 4 and 6 positions on the inorganic layer as described above. Accordingly, it is presumed that the bonding strength between the inorganic layer and the organic layer (hereinafter, referred to as bonding strength) is high.

The chemical bond between the inorganic layer and the organic layer can be measured, for example, as follows: Ar-GCIB (gas cluster ion beam of Ar) is irradiated for etching, and Bi$^{3+}$ is irradiated as a primary ion source so that secondary ions are generated, and the resulting secondary ions are analyzed using a time-of-flight type mass spectrometer to obtain a spectrum, and information of the bonding state at the interface between the inorganic layer and the organic layer can be obtained from the resulting spectrum, so that the chemical bond between the inorganic layer and the organic layer can be measured using an apparatus such as TOF.SIMS$^5$ manufactured by ION-TOF Corporation.

As described above, when Ar-GCIB is irradiated, the molecular structure is not broken in the depth direction from the uppermost surface upon etching, and accordingly the accurate information of the bonding state at the interface between the inorganic layer and the organic layer can be obtained.

When the inorganic layer contains aluminum oxide, chemical bond(s) of Al—S and/or Al—O—S are formed between the inorganic layer and the organic layer, and when the inorganic layer contains silicon oxide, chemical bond(s) of Si—S and/or Si—O—S are formed between the inorganic layer and the organic layer. When the inorganic layer contains aluminum oxide and silicon oxide, chemical bond(s) of Al—S and/or Al—O—S as well as chemical bond(s) of Si—S and/or Si—O—S are formed between the inorganic layer and the organic layer.

The information relevant to the bonding strength can be also obtained from the intensity of the secondary ions generated from the interface. The intensity of the secondary ions generated from the interface is preferably 15 counts/sec or more, more preferably 20 counts/sec or more, and particularly preferably 25 counts/sec or more. When the intensity of the secondary ions generated from the interface is 15 counts/sec or more, the adhesive strength between the inorganic layer and the organic layer is high so that the laminate film is provided with lamination strength sufficient for practical use. The intensity of the secondary ions generated from the interface can be obtained by TOF-SIMS measurement under the following conditions.

Ar-GCIB load pressure: 3 MPa
Measurement surface: 150 μm square
Measurement mode: High mass resolution The bonding strength is made high in the case of forming an organic layer containing a 1,3,5-triazine derivative having a sulfur-containing group as a substituent on at least one of 2, 4 and 6 positions on an inorganic layer than in the case of forming an organic layer containing a 1,3,5-triazine derivative having no sulfur-containing group as a substituent on 2, 4 and 6 positions on an inorganic layer. In the organic layer containing a 1,3,5-triazine derivative having a sulfur-containing group as a substituent on at least one of 2, 4 and 6 positions, the bonding strength is made high when the number of the sulfur-containing group (substituent) constituting the 1,3,5-triazine derivative is large. That is, the bonding strength is made high when the organic layer contains a 1,3,5-triazine derivative having sulfur-containing groups as a substituent on any two of 2, 4 and 6 positions than a 1,3,5-triazine derivative having a sulfur-containing group as a substituent on any one of 2, 4 and 6 positions. Further, the bonding strength is made high when the organic layer contains a 1,3,5-triazine derivative having sulfur-containing groups as a substituent on all of 2, 4 and 6 positions than a 1,3,5-triazine derivative having sulfur-containing groups as a substituent on any two of 2, 4 and 6 positions.

When the bonding strength is made high, the adhesive force between the inorganic layer and the organic layer is also made high. When the adhesive force is made high, it is presumed that gas permeation from the interface side between the inorganic layer and the organic layer hardly occurs so that gas barrier properties are also excellent.

[Physical Properties of Laminate Film]

The laminate film has an oxygen permeability of preferably 20 ml/m² dMPa or lower, more preferably 17 ml/m² dMPa or lower, furthermore preferably 15 ml/m² dMPa or lower, and even more preferably 10 ml/m² dMPa or lower.

The lamination strength is normally preferably 0.4 N/15 mm or more, more preferably 2.0 N/15 mm or more, furthermore preferably 4.0 N/15 mm or more, and even more preferably 5.0 N/15 mm or more. The lamination strength is preferably 0.2 N/15 mm or more, more preferably 1.5 N/15 mm or more, furthermore preferably 2.0 N/15 mm or more, even more preferably 3.2 N/15 mm or more, and particularly preferably 4.2 N/15 mm or more in the state where water is applied to the interlayer between the laminate film and a non-stretched polypropylene film stuck onto the laminate film.

Methods for measuring the oxygen permeability and the lamination strength will be described below.

[Other Layers]

The laminate film of the present invention may be provided with various kinds of layers included in a known laminate film besides the plastic film, the inorganic layer and the organic layer based on necessity.

For example, when the laminate film including the inorganic layer and the organic layer is used as a packaging material, a heat sealable resin layer called sealant is preferably formed. The formation of the heat sealable resin layer may be usually carried out by an extrusion lamination method or a dry lamination method. A thermoplastic polymer forming the heat sealable resin layer may be any polymer which can sufficiently obtain sealant adhesion properties, and polyethylene resins such as HDPE, LDPE and LLDPE, polypropylene resins, ethylene-vinyl acetate copolymers, ethylene-α-olefin random copolymers, ionomer resins, etc can be used.

In the laminate film of the present invention, at least one of a printing layer and other plastic substrate and/or paper substrate may be laminated between any of two neighboring layers of the plastic film, the organic layer and the inorganic layer or on the outside of the outermost layer.

A printing ink for forming the printing layer may be an aqueous resin-containing printing ink or a solvent-based resin-containing printing ink. Examples of the resin to be used for the printing ink include acrylic resins, urethane-based resins, polyester-based resins, vinyl chloride-based resins, vinyl acetate copolymer resins, and their mixtures. The printing ink may contain known additives such as an antistatic agent, a lightproof agent, an ultraviolet absorber, a plasticizer, a lubricant, a filler, a coloring agent, a stabilizer, a lubricant, a defoaming agent, a crosslinking agent, an anti-blocking agent and an antioxidant. A printing method for forming the printing layer is not particularly limited, and known printing methods such as an offset printing method, a gravure printing method and a screen printing method may be employed. In order to dry the solvent after printing, known drying methods such as hot air drying, hot roll drying and infrared drying may be employed.

On the other hand, examples of the other plastic substrate and the paper substrate to be preferably used include paper, polyester resins, polyamide resins, biodegradable resins, etc., from the viewpoint of providing the laminated body with sufficient rigidity and strength. A stretched film such as a biaxially stretched polyester film or a biaxially stretched nylon film is preferable for making the film excellent in mechanical strength.

EXAMPLES

Hereinafter, the present invention will be specifically described with reference to examples, but the invention is not limited to the following examples and can be carried out by appropriate modifications within a range adaptable to the above-mentioned and the later-described purposes, and all the modifications are encompassed within the technical scope of the invention.

The evaluation methods and the physical property measurement methods for samples obtained in respective examples and comparative examples are as follows.

(1) Method for evaluation of oxygen permeability
According to an electrolytic sensor method in JIS-K7126-2

(B method: isopiestic method), each sample was subjected to oxygen permeability measurement in normal state under an atmosphere of a temperature of 23° C. and a humidity of 65% RH by using an oxygen permeability measurement apparatus ("OX-TRAN 2/21", manufactured by MOCON, Inc.). The oxygen permeability measurement was carried out in the direction of permeating each laminate film from the organic layer side to the plastic film side with oxygen.

(2) Production of Laminate for Evaluation

A urethane-based two-component curable adhesive (obtained by blending "Takelac (registered trademark) A525S" with "Takenate (registered trademark) A50" (manufactured by Mitsui Chemicals Inc.) and ethyl acetate (manufactured by NACALAI TESQUE, INC.) at 13.5:1:8.2 (mass ratio) was applied onto each sample by a wire bar #5 so as to have a thickness of about 4 μm, and then, the resulting sample was kept still in an oven at 60° C. for 30 seconds to evaporate the solvent. Thereafter, an un-stretched polypropylene film having a thickness of 70 μm (Pylen Film (registered trademark) P1146, manufactured by Toyobo Co., Ltd.) was stuck to the sample by dry lamination method, and the resulting body was subjected to seasoning at 40° C. for 3 days to obtain a laminate gas-barrier body for evaluation (hereinafter, may be referred to as laminate).

(3) Method for Evaluation of Lamination Strength

Each laminated laminate body produced in (2) was cut into a size of 15 mm in width and 200 mm in length to obtain a test piece and the lamination strength was measured in conditions of a temperature of 23° C. and a relative humidity of 65% by using a Tensilon universal material testing machine ("TENSILON UMT-II-500 model", manufactured by Toyo Baldwin Corporation). The lamination strength measurement was carried out in the following two states. First, the lamination strength was measured at the time of peeling the layers at a peeling angle of 90 degrees with a tensile speed adjusted to 200 mm/minute in normal state. Then, the lamination strength was also measured at the time of peeling the layers at a peeling angle of 90 degrees with a tensile speed adjusted to 200 mm/minute and water applied to the interlayer between the laminate film and the un-stretched polypropylene film stuck to the laminate film.

(4) Method for Measurement of Bonding State

The bonding state of the inorganic layer and the organic layer for each sample was measured by a time-of-flight type secondary ion mass spectrometer (TOF-SIMS). Specifically, Ar-GCIB (gas cluster ion beam of Ar) was irradiated for etching, and $Bi^{3+}$ was irradiated as a primary ion source so that secondary ions were generated from the interface in the thickness direction, and the resulting secondary ions were analyzed to obtain a spectrum, and accordingly the bonding state of the inorganic layer and the organic layer was measured by the resulting spectrum. The above measurement was carried out by setting the Ar-GCIB load pressure to 3 MPa, the measurement surface to 150 μm square, and the measurement mode to high mass resolution. An apparatus TOF.SIMS[5] manufactured by ION-TOF Corporation was used for the measurement.

Regarding the intensity of the secondary ions generated from the interface, the measured values are of those relevant to bonding such as AlS, SiS, $AlSO_3$, $SiSO_3$, AlN and SiN.

FIG. 1 is a schematic diagram of a vapor deposition apparatus for producing the laminate film of the present invention, but the vapor deposition apparatus is not limited to this apparatus.

In FIG. 1, 1 denotes a substrate (film), specifically a film including an inorganic layer which is fed out from a winding roll; and 2 denotes a roll supporting the film 1, and the film 1 is moved along rolls 3 and 3'. Alternatively, a sheet film having a specified size may be fixed to metal fittings. A crucible 4 is for holding a 1,3,5-triazine derivative 5, and the 1,3,5-triazine derivative evaporated by heating is vapor-deposited on the inorganic layer of the film.

The apparatus illustrated in FIG. 1 is housed in a vacuum chamber (not illustrated) which can be vacuumed to $1.0 \times 10^{-5}$ Pa. In this case, the laminate film of the present invention can be also produced by using equipment for vapor-depositing an inorganic layer on a film and using a film including no inorganic layer. This makes it possible to produce the laminate film of the present invention continuously in a single vacuum apparatus.

Example 1

First, a polyester film on which ceramic (silica/alumina) was vapor-deposited ("ECOSYAR (registered trademark) VE 100", manufactured by Toyobo Co., Ltd., thickness: 12 μm) was set on a position opposite to the crucible 4 in the vapor deposition apparatus, and the inside of the crucible 4 was filled with 5 g of 2-amino-1,3,5-triazine-4,6-dithiol (manufactured by Alfa-Aesar) (hereinafter, referred to as triazine dithiol). The polyester film on which ceramic (silica/alumina) is vapor-deposited can be manufactured in accordance with the method described in, for example, JP-A-2013-014126.

Next, the inside of the vapor deposition apparatus was vacuum-evacuated to lower the pressure to $5.0 \times 10$ Pa, and thereafter, the triazine dithiol was heated at 180° C. for 60 minutes to remove water, impurities, etc. Then, the triazine dithiol was heated to 350° C., and was vapor-deposited on the surface of the polyester film where the ceramic had been vapor-deposited, so that a laminate film was obtained which included an organic layer having a thickness of 50 nm on the surface where the ceramic had been vapor-deposited. The physical properties and evaluation results of the obtained laminate film are shown in Table 1.

Example 2

A laminate film was obtained in the same manner as in Example 1, except that the vapor deposition raw material was changed to triazine trithiol (manufactured by Tokyo Kagaku Kogyo K.K.), the triazine trithiol was heated to 250° C., and was vapor-deposited on the surface of the polyester film where the ceramic had been vapor-deposited, and the amount of the triazine trithiol was adjusted so as to change the thickness of the organic layer to 200 nm in Example 1. The physical properties and evaluation results of the obtained laminate film are shown in Table 1.

Example 3

A laminate film was obtained in the same manner as in Example 1, except that the vapor deposition raw material was changed to triazine trithiol, the triazine trithiol was heated to 250° C., and was vapor-deposited on the surface of the polyester film where the ceramic had been vapor-deposited, and the amount of the triazine trithiol was adjusted so as to change the thickness of the organic layer to 150 nm in Example 1. The physical properties and evaluation results of the obtained laminate film are shown in Table 1.

Example 4

A laminate film was obtained in the same manner as in Example 1, except that the vapor deposition raw material was changed to triazine trithiol, the triazine trithiol was heated to 250° C., and was vapor-deposited on the surface of the polyester film where the ceramic had been vapor-deposited, and the amount of the triazine trithiol was adjusted so as to change the thickness of the organic layer to 100 nm in Example 1. The physical properties and evaluation results of the obtained laminate film are shown in Table 1.

Example 5

A laminate film was obtained in the same manner as in Example 1, except that the vapor deposition raw material was changed to triazine trithiol, the triazine trithiol was heated to 250° C., and was vapor-deposited on the surface of the polyester film where the ceramic had been vapor-deposited, and the amount of the triazine trithiol was adjusted so as to change the thickness of the organic layer to 53 nm in Example 1. The physical properties and evaluation results of the obtained laminate film are shown in Table 1.

Example 6

A laminate film was obtained in the same manner as in Example 1, except that the amount of the triazine dithiol was adjusted so as to change the thickness of the organic layer to 200 nm in Example 1. The physical properties and evaluation results of the obtained laminate film are shown in Table 1.

Example 7

A laminate film was obtained in the same manner as in Example 1, except that the amount of the triazine dithiol was adjusted so as to change the thickness of the organic layer to 100 nm in Example 1. The physical properties and evaluation results of the obtained laminate film are shown in Table 1.

Comparative Example 1

A laminate film was obtained in the same manner as in Example 1, except that the vapor deposition raw material was changed to melamine (manufactured by Wako Pure Chemical Industries, Ltd.), the melamine was heated to 250° C., and was vapor-deposited on the surface of the polyester film where the ceramic had been vapor-deposited, and the thickness of the organic layer is changed to 118 nm in Example 1. The physical properties and evaluation results of the obtained laminate film are shown in Table 1.

Comparative Example 2

A laminate film was obtained in the same manner as in Example 1, except that the vapor deposition raw material was changed to melamine (manufactured by Wako Pure Chemical Industries, Ltd.), the melamine was heated to 250° C., and was vapor-deposited on the surface of the polyester film where the ceramic had been vapor-deposited, and the thickness of the organic layer is changed to 59 nm in Example 1. The physical properties and evaluation results of the obtained laminate film are shown in Table 1.

Comparative Example 3

A laminate film was obtained in the same manner as in Example 1, except that a polyethylene terephthalate film including no inorganic layer ("COSMOSHINE (registered trademark) A 4100", manufactured by Toyobo Co., Ltd., thickness: 50 μm) was used, and the amount of the triazine dithiol was adjusted to change the thickness of the organic layer formed on the polyethylene terephthalate film to 109 nm in Example 1. The physical properties and evaluation results of the obtained laminate film are shown in Table 1. Herein, "no bonding" means no bonding of AlS, SiS, AlSO$_3$, SiSO$_3$, AlN and SiN was observed, and the same shall apply for all of comparative examples hereinafter.

Comparative Example 4

A laminate film was obtained in the same manner as in Example 1, except that a polyethylene terephthalate film having no inorganic layer ("COSMOSHINE (registered trademark) A 4100", manufactured by Toyobo Co., Ltd., thickness: 50 μm) was used, the vapor deposition raw material was changed to triazine trithiol, and the amount of the triazine trithiol was adjusted to change the thickness of the organic layer formed on the polyethylene terephthalate film to 100 nm in Example 1. The physical properties and evaluation results of the obtained laminate film are shown in Table 1.

Comparative Example 5

Evaluations were carried out in the state where no organic layer was formed on the polyester film used in Example 1. The physical properties and the evaluation results are shown in Table 1.

Comparative Example 6

Evaluations were carried out in a state that no organic layer was formed on the polyethylene terephthalate film used in Comparative Examples 3 and 4. The physical properties and the evaluation results are shown in Table 1.

TABLE 1

| | polyester film | vapor deposition raw material | thickness of the organic gas barrier layer (nm) | bonding state of the inorganic layer and the organic layer | intensity of the secondary ions (counts/sec) | oxygen permeability (ml/m$^2$dMPa) | lamination strength(N/15 mm) normal | water is applied |
|---|---|---|---|---|---|---|---|---|
| Example 1 | VE100 | triazine dithiol | 50 | AlS, SiS, AlSO$_3$, SiSO$_3$ | 30 | 20 | 4.1 | 3.2 |
| Example 2 | VE100 | triazine trithiol | 200 | AlS, SiS, AlSO$_3$, SiSO$_3$ | 30 | 6.1 | 5.9 | 4.9 |
| Example 3 | VE100 | triazine trithiol | 150 | AlS, SiS, AlSO$_3$, SiSO$_3$ | 30 | 7.5 | 6.0 | 5.5 |
| Example 4 | VE100 | triazine trithiol | 100 | AlS, SiS, AlSO$_3$, SiSO$_3$ | 30 | 9 | 6.2 | 6.0 |
| Example 5 | VE100 | triazine trithiol | 53 | AlS, SiS, AlSO$_3$, SiSO$_3$ | 30 | 11 | 5.0 | 4.2 |

TABLE 1-continued

| | polyester film | vapor deposition raw material | thickness of the organic gas barrier layer (nm) | bonding state of the inorganic layer and the organic layer | intensity of the secondary ions (counts/sec) | oxygen permeability (ml/m²dMPa) | lamination strength(N/15 mm) normal | lamination strength(N/15 mm) water is applied |
|---|---|---|---|---|---|---|---|---|
| Example 6 | VE100 | triazine dithiol | 200 | AlS, SiS, AlSO₃, SiSO₃ | 15 | 17 | 0.4 | 0.2 |
| Example 7 | VE100 | triazine dithiol | 100 | AlS, SiS, AlSO₃, SiSO₃ | 15 | 12 | 2.0 | 1.6 |
| Comparative Example 1 | VE100 | melamine | 118 | AlN, SiN | 1 | 9.6 | 0.2 | 0.0 |
| Comparative Example 2 | VE100 | melamine | 59 | AlN, SiN | 1 | 20 | 0.1 | 0.0 |
| Comparative Example 3 | PET | triazine dithiol | 109 | no bonding | 0 | 250 | 0.0 | 0.0 |
| Comparative Example 4 | PET | triazine trithiol | 100 | no bonding | 0 | 50 | 0.1 | 0.0 |
| Comparative Example 5 | VE100 | — | 0 | no bonding | 0 | 30 | 6.5 | 5.8 |
| Comparative Example 6 | PET | — | 0 | no bonding | 0 | 250 | 12.0 | 7.8 |

INDUSTRIAL APPLICABILITY

The laminate film of the present invention can obtain both of adhesion properties and gas barrier properties even when an inorganic layer and an organic layer were formed on a surface of a plastic film. Therefore, the laminate film of the present invention is widely applicable to not only uses for packaging of foods, pharmaceutical products, industrial products, etc. but also to industrial uses for solar cells, electronic paper, organic EL elements, semiconductor elements, etc.

DESCRIPTION OF THE NUMERALS 1 film
2 roll
3, 3' roll
4 crucible
5 1,3,5-triazine derivative

The invention claimed is:

1. A laminate film comprising a plastic film, and an inorganic layer and an organic layer containing a 1,3,5-triazine derivative laid on at least one surface of the plastic film, wherein
the inorganic layer consists of a compound selected from metal oxide, metal nitride, metal fluoride, metal sulfide, and combinations thereof,
the organic layer has a thickness of 300 nm or less, and
the 1,3,5-triazine derivative is at least one compound selected from formula (1) to (3)

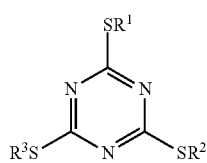

(1)

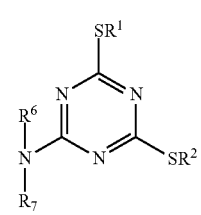

(2)

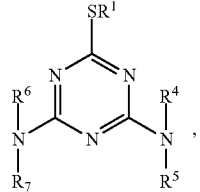

(3)

wherein $R^1$-$R^7$ in formula (1) to (3) are the same or different and each is selected from the group consisting of H, $CH_3$, $C_2H_5$, $C_4H_9$, $C_6H_{13}$, $C_8H_{17}$, $C_{10}H_{21}$, $C_{12}H_{25}$, $C_{18}H_{37}$, $C_{20}H_{41}$, $C_{22}H_{45}$, $C_{24}H_{49}$, $CF_3C_6H_4$, $C_4F_9C_5H_4$, $C_6F_{13}C_5H_4$, $C_8F_{17}C_6H_4$, $C_{10}F_{21}C_6H_4$, $C_6F_{11}C_6H_4$, $C_9F_{17}CH_2$, $C_{10}F_{21}CH_2$, $C_4F_9CH_2$, $C_6F_{13}CH_2CH_2$, $C_8F_{17}CH_2CH_2$, $C_{10}F_{21}CH_2CH_2$, $CH_2$=$CHCH_2$, $CH_2$=$CH(CH_2)_8$, $CH_2$=$CH(CH_2)_9$, $C_8H_{17}CH_2$=$C_8H_{16}$, $C_6H_{11}$, $C_6H_5CH_2$, $C_6H_5CH_2CH_2$, $CH_2$=$CH(CH_2)_4COOCH_2CH_2$, $CH_2$=$CH(CH_2)_8COOCH_2CH_2$, $CH_2$=$CH(CH_2)_9COOCH_2CH_2$, $C_4F_9CH_2$=$CHCH_2$, $C_6F_{13}CH_2$=$CHCH_2$, $C_8F_{17}CH_2$=$CHCH_2$, $C_{10}F_{21}CH_2$=$CHCH_2$, $C_4F_9CH_2CH(OH)CH_2$, $C_6F_{13}CH_2CH(OH)CH_2$, $C_8F_{17}CH_2CH(OH)CH_2$, $C_{10}F_{21}CH_2CH(OH)CH_2$, $CH_2$=$CH(CH_2)_4COO(CH_2CH_2)_2$, $CH_2$=$CH(CH_2)_8COO(CH_2CH_2)_2$, $CH_2$=$CH(CH_2)_9COO(CH_2CH_2)_2$, $C_4F_9COOCH_2CH_2$, $C_6F_{13}COOCH_2CH_2$, $C_8F_{17}COOCH_2CH_2$, and $C_{10}F_{21}COOCH_2CH_2$.

2. The laminate film according to claim 1, wherein the inorganic layer is laid on at least one surface of the plastic film, and the organic layer is laid on a surface of the inorganic layer.

3. The laminate film according to claim 2, wherein the 1,3,5-triazine derivative is triazine trithiol or triazine dithiol.

4. The laminate film according to claim 2, wherein the 1,3,5-triazine derivative is triazine trithiol.

5. The laminate film according to claim 1, wherein the 1,3,5-triazine derivative is triazine trithiol or triazine dithiol.

6. The laminate film according to claim 1, wherein the 1,3,5-triazine derivative is triazine trithiol.

7. A laminate film comprising a plastic film, an inorganic layer laid on at least one surface of the plastic film, and an organic layer containing a 1,3,5-triazine derivative laid on a surface of the inorganic layer, wherein
the inorganic layer and the organic layer are vapor-deposited by a vacuum vapor deposition method,
the inorganic layer consists of a compound selected from metal oxide, metal nitride, metal fluoride, metal sulfide, and combinations thereof, the organic layer has a thickness of 300 nm or less, and
the 1,3,5-triazine derivative is triazine dithiol.

8. A laminate film comprising a plastic film, an inorganic layer laid on at least one surface of the plastic film, and an organic layer containing a 1,3,5-triazine derivative laid on a surface of the inorganic layer, wherein
   the inorganic layer and the organic layer are vapor-deposited by a vacuum vapor deposition method,
   the inorganic layer consists of a compound selected from metal oxide, metal nitride, metal fluoride, metal sulfide, and combinations thereof,
   the organic layer has a thickness of 300 nm or less, and
   the 1,3,5-triazine derivative is triazine trithiol.

* * * * *